United States Patent
Kim et al.

(10) Patent No.: US 9,312,188 B2
(45) Date of Patent: Apr. 12, 2016

(54) METHOD FOR FABRICATING SEMICONDUCTOR DEVICE

(71) Applicant: Samsung Electronics Co., Ltd., Suwon-si (KR)

(72) Inventors: Ju-Youn Kim, Suwon-si (KR); Sang-Duk Park, Hwaseong-si (KR); Jae-Kyung Seo, Yongin-si (KR); Kwang-Sub Yoon, Yongin-si (KR); In-Gu Yoon, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 43 days.

(21) Appl. No.: 14/169,608

(22) Filed: Jan. 31, 2014

(65) Prior Publication Data

US 2014/0370672 A1 Dec. 18, 2014

(30) Foreign Application Priority Data

Jun. 13, 2013 (KR) ........................ 10-2013-0067884

(51) Int. Cl.
*H01L 21/8238* (2006.01)

(52) U.S. Cl.
CPC *H01L 21/823807* (2013.01); *H01L 21/823814* (2013.01); *H01L 21/823821* (2013.01)

(58) Field of Classification Search
USPC .......... 257/190, 288, 314, 384, 351; 438/199, 438/231
See application file for complete search history.

(56) References Cited

U.S. PATENT DOCUMENTS

| | | | |
|---|---|---|---|
| 5,854,101 A * | 12/1998 | Wu | 438/231 |
| 7,045,467 B2 | 5/2006 | Yew | |
| 7,763,510 B1 | 7/2010 | Zhang et al. | |
| 7,985,690 B2 | 7/2011 | Thei et al. | |
| 8,093,116 B2 | 1/2012 | Chung et al. | |
| 8,110,496 B2 | 2/2012 | Bailey et al. | |
| 2004/0043337 A1 * | 3/2004 | Chen et al. | 430/329 |
| 2004/0063264 A1 * | 4/2004 | Zheng et al. | 438/199 |
| 2007/0202670 A1 | 8/2007 | Lee | |
| 2012/0220112 A1 * | 8/2012 | Hatakeyama et al. | 438/514 |

FOREIGN PATENT DOCUMENTS

| | | |
|---|---|---|
| KR | 2003002243 | 1/2003 |
| KR | 2007105730 | 10/2007 |
| KR | 2011034843 | 4/2011 |

* cited by examiner

*Primary Examiner* — Errol Fernandes
(74) *Attorney, Agent, or Firm* — Onello & Mello LLP

(57) ABSTRACT

In a method for fabricating a semiconductor device, a first gate electrode and a second gate electrode are provided on a substrate, the first gate electrode and the second gate electrode being formed in a first region and a second region of the substrate, respectively. A conductive buffer layer is formed along sidewalls of the first gate electrode and the second gate electrode and on upper surfaces of the first gate electrode and second gate electrode. A first mask pattern covering the first region of the substrate on the buffer layer is formed. A first impurity region is formed in the substrate at sides of the second gate electrode using the first mask pattern as a mask of an ion implantation process.

22 Claims, 13 Drawing Sheets

METHOD FOR FABRICATING SEMICONDUCTOR DEVICE

CROSS-REFERENCE TO RELATED APPLICATION

This application claims priority from Korean Patent Application No. 10-2013-0067884 filed on Jun. 13, 2013 in the Korean Intellectual Property Office, and all the benefits accruing therefrom under 35 U.S.C. 119, the content of which in its entirety is herein incorporated by reference.

BACKGROUND

Embodiments of the present inventive concepts relate to methods for fabricating semiconductor devices.

Semiconductor devices continue development at a rapid pace as information media become ever more ubiquitous. In current semiconductor products, there is an ever-increasing demand for high integration, along with increased quality and reduced cost. In order to achieve high integration, scaling down of semiconductor devices is needed.

Studies are being performed to meet the demands for increased operation speed and degree of integration in semiconductor devices. Such semiconductor devices includes discrete devices such as MOS transistors. However, along with further integration of semiconductor devices, the size of a gate of the MOS transistor is gradually reduced and the lower channel region of the gate is likewise gradually narrowed.

A critical dimension of the gate region of the transistor largely affects electrical properties of the transistor. That is, as the semiconductor device becomes more highly integrated, when the width of the gate region is narrowed, the resulting gap between the source region and the drain region which are formed with a gate region therebetween is also narrowed.

SUMMARY

In an aspect, a method for fabricating a semiconductor device comprises: providing a first gate electrode and a second gate electrode on a substrate, the first gate electrode and the second gate electrode being formed in a first region and a second region of the substrate, respectively; forming a conductive buffer layer along sidewalls of the first gate electrode and the second gate electrode and on upper surfaces of the first gate electrode and second gate electrode; forming a first mask pattern covering the first region of the substrate on the buffer layer; and forming a first impurity region in the substrate at sides of the second gate electrode using the first mask pattern as a mask of an ion implantation process.

In some embodiments, the first mask pattern comprises a bottom anti-reflective coating (BARC).

In some embodiments, the forming of a first mask pattern includes: forming a mask film which covers the first gate electrode and the second gate electrode on the buffer layer; and removing the mask film which covers the second region using a mixture gas including oxygen.

In some embodiments, the mixture gas further includes chlorine.

In some embodiments, a fraction of oxygen in the mixture gas is a first fraction and a fraction of chlorine in the mixture gas is a second fraction, and the second fraction is larger than the first fraction.

In some embodiments, the forming of a first mask pattern includes: forming a mask film which covers the first gate electrode and the second gate electrode on the buffer layer; and removing the mask film which covers the second region using mixture gas including nitrogen and hydrogen.

In some embodiments, the buffer layer includes a TiN film or an amorphous silicon film.

In some embodiments, the method further comprises: after forming the buffer layer and before forming the first mask pattern, forming an upper buffer layer along the buffer layer, wherein the upper buffer layer includes at least one of a silicon nitride film and a silicon oxide film.

In some embodiments, the method further comprises: before forming the buffer layer, forming a lower buffer layer along the first gate electrode and the second gate electrode.

In some embodiments, the forming of a buffer layer includes conformally forming the buffer layer on the substrate, the first gate electrode, and the second gate electrode.

In some embodiments, the method further comprises: after removing the first mask pattern, forming a second mask pattern which covers the second region on the buffer layer; and forming a second impurity region having a different conductive type from that of the first impurity region, in the substrate at sides of the first gate electrode using the second mask pattern as a mask of an ion implantation process.

In some embodiments, the second mask pattern comprises a BARC.

In some embodiments, the method further comprises: sequentially removing the second mask pattern and the buffer layer to expose the substrate, the first gate electrode, and the second gate electrode.

In some embodiments, the method further comprises: forming a first source/drain at sides of the first gate electrode; and forming a second source/drain at sides of the second gate electrode.

In some embodiments, the ion implantation process comprises a halo ion implantation process.

In another aspect, a method for fabricating a semiconductor device comprises: forming a first active region and a second active region; forming a gate electrode intersecting the first active region and the second active region on the first active region and the second active region; conformally forming a conductive buffer layer on the first active region, the second active region, and the gate electrode; forming a first mask pattern covering the first active region on the buffer layer; and performing a halo ion implantation process in the second active region at sides of the gate electrode using the first mask pattern.

In some embodiments, the method further comprises: after removing the first mask pattern, forming a second mask pattern which covers the second active region on the buffer layer; and performing the halo ion implantation process on the first active region at sides of the gate electrode using the second mask pattern.

In some embodiments, the first mask pattern is a BARC

In some embodiments, the buffer layer includes a TiN film or an amorphous silicon film.

In some embodiments, the first active region is a region where a pull-up transistor of an SRAM is formed and the second active region is a region where a pull-down transistor of the SRAM is formed.

In some embodiments, the first active region and the second active region are fin type active patterns.

In another aspect, a method for fabricating a semiconductor device, comprises: forming a first fin type active pattern and a second fin type active pattern on a substrate, the first fin type active pattern and the second fin type active pattern being formed in a first region and a second region of the substrate, respectively; forming a first dummy gate electrode intersecting the first fin type active pattern on the first fin type active pattern and a second dummy gate electrode intersecting the second fin type active pattern on the second fin type active pattern; forming a buffer layer including a TiN film or amorphous silicon on the first and second fin type active patterns and the first and second dummy gate electrodes; forming a first mask pattern covering the first region on the buffer layer, the first mask pattern comprising a BARC; forming a first impurity region in the second fin type active pattern at sides of the second dummy gate electrode using the first mask pattern as a mask of an ion implantation process; after removing the first mask pattern, forming a second mask pattern covering the second region on the buffer layer, the second mask pattern being a BARC; and forming a second impurity region having a different conductive type from the first impurity region, in the first fin type active pattern at sides of the first dummy gate electrode using the second mask pattern as a mask of an ion implantation process.

In some embodiments, the first impurity region and the second impurity region comprises halo ion implantation regions.

In some embodiments, the method further comprises: sequentially removing the second mask pattern and the buffer layer; forming a first source/drain at sides of the first dummy gate electrode; and forming a second source/drain at sides of the second dummy gate electrode.

In some embodiments, the method further comprises: forming an interlayer insulating layer which covers the first and second dummy gate electrodes and the first and second sources/drains, on the substrate; planarizing the interlayer insulating layer to expose the first dummy gate electrode and the second dummy gate electrode; removing the first dummy gate electrode and the second dummy gate electrode to form a first trench and a second trench in the interlayer insulating layer; and forming a first gate electrode which buries the first trench and a second gate electrode which buries the second trench.

In another aspect, a method for fabricating a semiconductor device, comprises: providing a first gate structure and a second gate structure on a substrate, at a first region and a second region of the substrate, respectively; forming a conductive buffer layer along sidewalls of the first gate structure and the second gate structure and on upper surfaces of the first gate structure and second gate structure; forming a first mask pattern covering the first region of the substrate on the buffer layer; and forming a first impurity region in the substrate at sides of the second gate structure using the first mask pattern as a mask of an ion implantation process.

In some embodiments, the first gate structure comprises a first gate electrode and wherein the second gate structure comprises a second gate electrode.

In some embodiments, the first impurity region is formed following providing the first gate electrode and the second gate electrode.

In some embodiments, the conductive buffer layer is present on the sidewalls and upper surfaces of the second gate structure during forming of the first impurity region.

In some embodiments, the first gate structure comprises a first dummy gate electrode and wherein the second gate structure comprises a second dummy gate electrode.

In some embodiments, the method further comprises, following forming the first impurity region, replacing the first dummy gate electrode and the second dummy gate electrode with first and second gate electrodes respectively.

In some embodiments, the conductive buffer layer is present on the sidewalls and upper surfaces of the second gate structure during forming of the first impurity region.

BRIEF DESCRIPTION OF THE DRAWINGS

The above and other features and advantages of the present inventive concepts will become more apparent by describing in detail embodiments thereof with reference to the attached drawings in which.

DETAILED DESCRIPTION OF EMBODIMENTS

Figure 1:
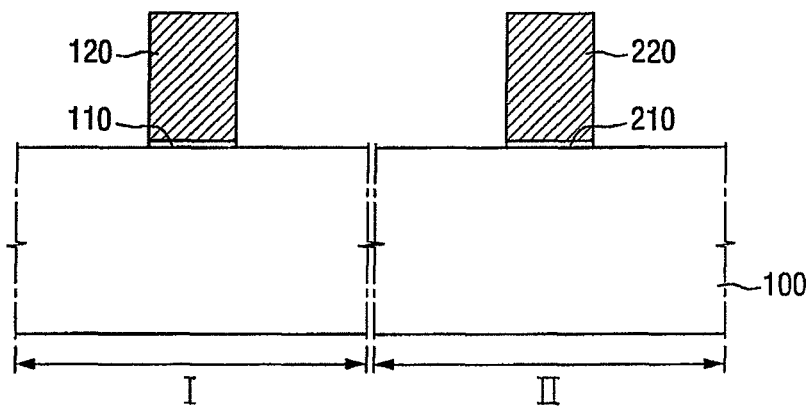
FIGS. 1 to 11 are diagrams illustrating intermediate processes of a method for fabricating a semiconductor device according to an embodiment of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concepts of the inventive concepts to those skilled in the art, and the present inventive concepts will only be defined by the appended claims. Like reference numerals refer to like elements throughout the specification.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a method of fabricating a semiconductor device according to an embodiment of the present inventive concepts will be described with reference to FIGS. 1 to 11.

FIGS. 1 to 11 are diagrams illustrating intermediate processes of a method for fabricating a semiconductor device according to an embodiment of the present inventive concepts.

Referring to FIG. 1, a substrate 100 including a first region I and a second region II is provided. The first region I and the second region II may be separated from each other, for example by an isolation region, or connected to each other.

The first region I and the second region II may include an active region in which a gate of a transistor is formed. In FIG. 1, for the convenience of description, an isolation layer is not illustrated but only an active region is illustrated.

In the method for fabricating a semiconductor device according to the embodiments of the present inventive concepts, the first region I may be a PMOS region and a second region II may be an NMOS region. For example, in the first region I, a pull up transistor of an SRAM may be formed and in the second region II, a pull down transistor or a pass transistor of the SRAM may be formed.

In various embodiments, the substrate 100 may comprise a bulk silicon or a silicon-on-insulator (SOI). Alternatively, the substrate 100 may comprise a silicon substrate or may optionally include other materials, for example, germanium, silicon germanium, indium antimonide, a lead telluride compound, indium arsenide, indium phosphide, gallium arsenide, or gallium antimonide. However, embodiments are not limited thereto, and any of a number of suitable substrate materials are equally applicable to the present inventive concepts.

In the first region I on the substrate 100, a first gate dielectric film 110 and a first gate electrode 120 are formed. In the second region II on the substrate 100, a second gate dielectric film 210 and a second gate electrode 220 are formed. Even though not illustrated, gate hard masks may be further formed on the first gate electrode 120 and the second gate electrode 220, respectively.

The first gate dielectric film 110 and a second gate dielectric film 210 may comprise, for example, a silicon oxide film, SiON, $Ge_xO_yN_z$, $Ge_xSi_yO_z$, a dielectric film having a high dielectric constant, a combination thereof, or a lamination layer in which the above-mentioned layers are sequentially laminated. The dielectric film having a high dielectric constant may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto. The first gate dielectric film 110 and the second gate dielectric film 210 may be formed using, for example, thermal treatment, chemical treatment, an atomic layer deposition (ALD) method, or a chemical vapor deposition (CVD) method, or other suitable formation method. When the first gate dielectric film 110 and the second gate dielectric film 210 include a dielectric substance having a high dielectric constant, a barrier layer may be further formed between the first gate dielectric film 110 and the first gate electrode 120 and/or the second gate dielectric film 210 and the second gate electrode 220. The barrier layer may include at least one of titanium nitride (TiN), tantalum nitride (TaN), and a combination thereof.

The first gate electrode 120 and the second gate electrode 220 may be silicon and specifically, and may include one of poly silicon (polySi), amorphous silicon (a-Si), titanium (Ti), titanium nitride (TiN), tantalum nitride (TaN), aluminum (Al), tungsten (W), and a combination thereof. The poly silicon may be formed using a chemical vapor deposition method and the amorphous silicon may be formed using a sputtering method, a chemical vapor deposition method, or a plasma deposition method, but is not limited thereto, as other suitable methods are equally applicable to the present inventive concepts.

Figure 2:
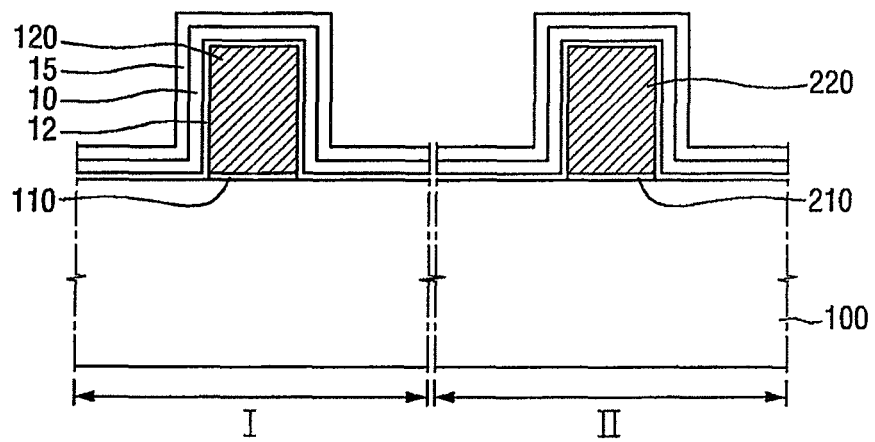

Referring to FIG. 2, on the substrate 100, a lower buffer layer 12, a buffer layer 10, and an upper buffer layer 15 are sequentially formed. Specifically, the lower buffer layer 12, the buffer layer 10, and the upper buffer layer 15 are sequentially formed along sidewalls of the first gate electrode 120 and the second gate electrode 220 and on upper surfaces of the first gate electrode 120 and the second gate electrode 220.

In some embodiments, the lower buffer layer 12, the buffer layer 10, and the upper buffer layer 15 may be conformally formed on the substrate 100, the first gate electrode 120, and the second gate electrode 220, respectively.

Specifically, in some embodiments, the lower buffer layer 12 is formed along upper and sidewall surfaces of the first gate electrode 120 and the second gate electrode 220 on the substrate 100. In some embodiments, the lower buffer layer 12 may include silicon nitride and be formed using a chemical vapor deposition method or an atomic layer deposition method, or other suitable formation method.

The buffer layer 10 is formed along the lower buffer layer 12. In some embodiments, the buffer layer 10 may include a conductive material, and for example, a TiN layer or an amorphous silicon layer. The buffer layer 10 may be formed using the chemical vapor deposition method or the atomic layer deposition method. A thickness of the buffer layer 10 is for example, 30 Å or larger and 200 Å or smaller. In a subsequent process, the buffer layer 10 may serve as an etch stop layer and/or a buffer of an ion implantation process.

The upper buffer layer 15 is formed along the buffer layer 12. The upper buffer layer 15 may include at least one of a silicon nitride film and a silicon oxide film and may be formed using the chemical vapor deposition method or the atomic layer deposition method. A thickness of the upper buffer layer 15 is for example, 30 Å or larger and 100 Å or smaller. In a subsequent process, the upper buffer layer 15 may serve as an etch stop layer and/or a buffer of an ion implantation process, together with the buffer layer 10.

In the method for fabricating a semiconductor device according to the embodiments of the present inventive concepts, it is described that the buffer layer 10 and the upper buffer layer 15 are formed together, but the inventive concepts are not limited thereto. That is, in some embodiments, the buffer layer 10 is formed on the lower buffer layer 12, and the upper buffer layer 15 is not formed on the buffer layer 10.

Figure 3:
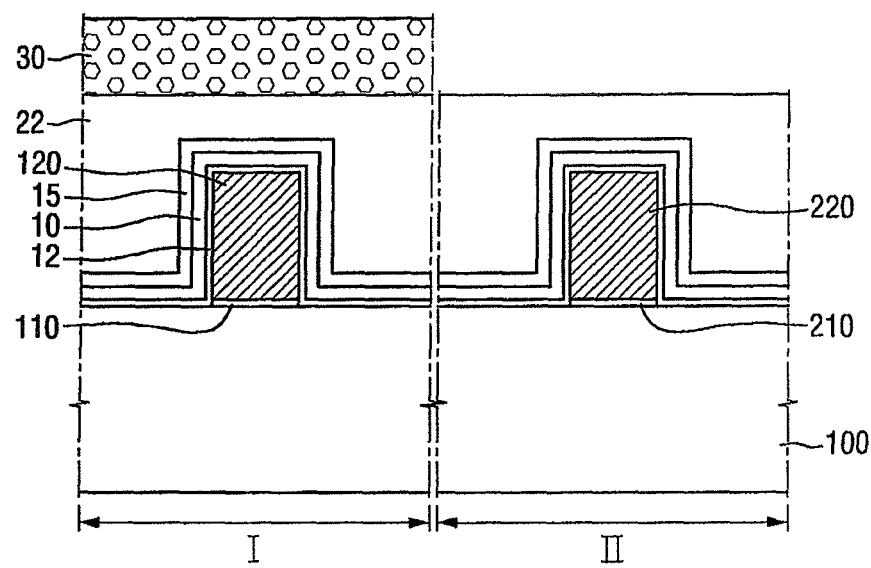

Referring to FIG. 3, a first mask film 22 which covers the first gate electrode 120 and the second gate electrode 220 are formed on the buffer layer 10. Specifically, the first mask film 22 which is formed on the buffer layer 10 is formed so as to be in contact with the upper buffer layer 15.

In the method for fabricating a semiconductor device according to the embodiments of the present inventive concepts, the first mask film 22 may comprise a BARC (bottom anti-reflective coating) film.

Next, a photosensitive film pattern 30 is formed on the first mask film 11. The first photosensitive film pattern 30 exposes the first mask film 22 which is formed on the second gate electrode 220 but covers the first mask film 22 which is formed on the first gate electrode 120.

In other words, the first photosensitive film pattern 30 is formed on the first region I to expose the second region II. Further, the first photosensitive film pattern 30 overlaps the first gate electrode 120 but does not overlap the second gate electrode 220.

Figure 4:
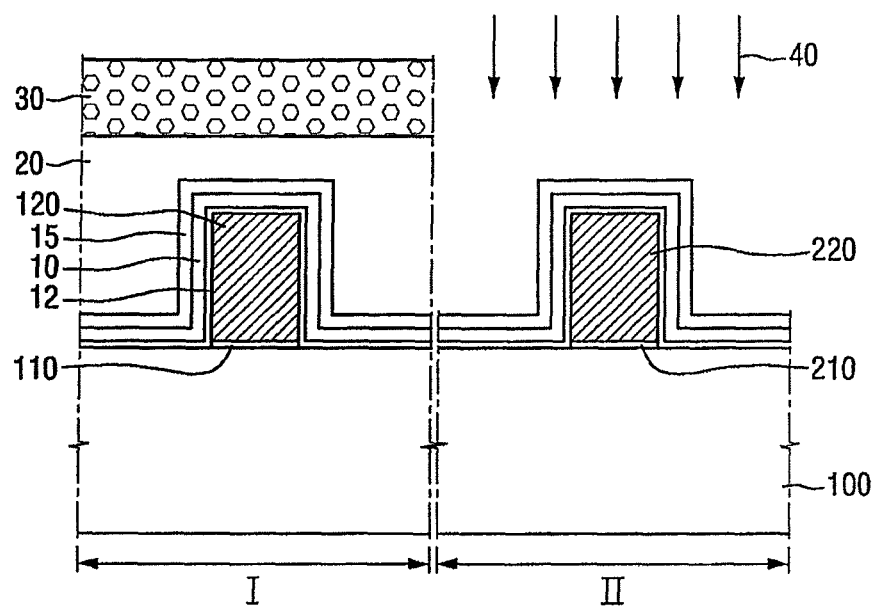

Referring to FIG. 4, the first photosensitive film pattern 30 is used as a mask of a first etching process to remove the first mask film 22 which is formed in the second region II. That is, by the first etching process 40, a first mask pattern 20 which covers the first region I of the substrate 100 is formed on the buffer layer 10. In some embodiments, the first mask pattern 20 which is formed in the first region I is the BARC pattern.

In other words, the first mask film 22 which covers the second region II is removed by the first etching process 40 to form the first mask pattern 20. The upper buffer layer 15 is exposed by the first mask pattern 20. The first mask pattern 20 is formed by the first etching process 40 so that the upper buffer layer 15 may serve as an etch stop layer for the first etching process 40 in the second region II.

In some embodiments, the first mask pattern 20 and the first photosensitive film pattern 30 which are formed in the first region I form a lamination layer to be used as a mask in the first ion implantation process 50 which will be performed later.

In some embodiments, the first etching process 40 which removes the first mask film 22 which covers the second region II may be a dry etching process and for example, a reactive ion etching (RIE) process.

As an example of the dry etching used to form the first mask pattern 20, a mixture gas including oxygen is used as an etching gas to etch and remove the first mask film 22 which covers the second region II. In some embodiments, the mixture gas which is used as the etching gas may include chlorine in addition to oxygen. Further, the mixture gas may further include helium, or another suitable element or compound.

In the mixture gas which is used in the etching process, a fraction of oxygen is a first fraction, a fraction of chlorine is a second fraction, and a fraction of helium is a third fraction. In some embodiments of the method for fabricating a semiconductor device according to the embodiments of the present inventive concepts, in the mixture gas, the second fraction of chlorine may be larger than the first fraction of oxygen. For example, in the mixture gas, a ratio of the second fraction of chlorine with respect to the first fraction of oxygen may be a value between 1.1 and 7.

Further, in other embodiments, in the mixture gas, the third fraction of helium may be larger than the first fraction of oxygen and the second fraction of chlorine. In addition, in the mixture gas, an amount of helium may be larger than a total amount of oxygen and chlorine.

When the first mask film 22 which covers the second region II is removed by the reactive ion etching process, a bias may be applied to the substrate 100. For example, the bias which is applied to the substrate 100 may be between 10 V and 3000 V, but is not limited thereto. Further, in the reactive ion etching process, a power which generates plasma may be between 50 W and 600 W, but is not limited thereto.

As another example of the dry etching used to form the first mask pattern 20, mixture gas including nitrogen and hydrogen is used as the etching gas to etch and remove the first mask film 22 which covers the second region II.

Figure 5:
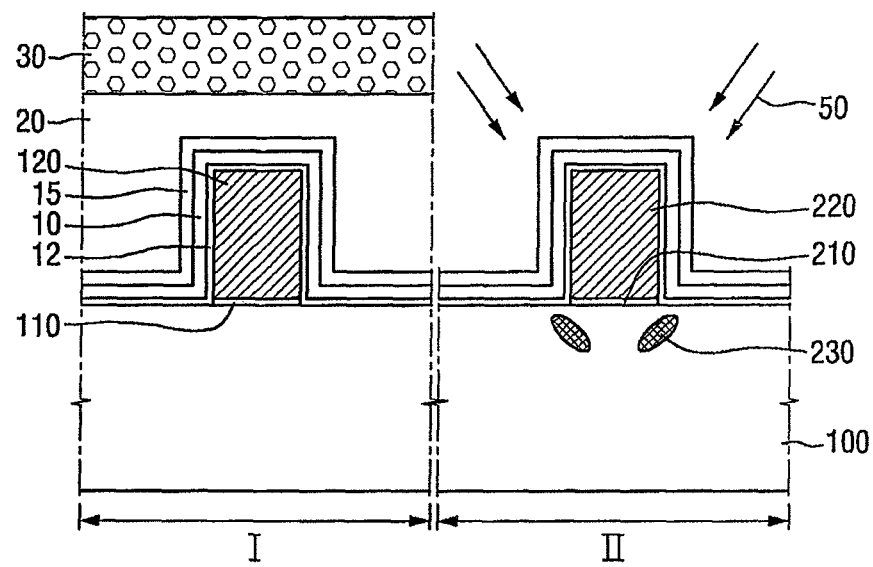

Referring to FIG. 5, the first mask pattern 20 is used as a mask of the first ion implantation process 50 to form a second impurity region 230 at side regions of the second gate electrode 220. The second impurity region 230 is formed in the substrate 100 of the second region II. Specifically, the mask pattern 20 and the first photosensitive film pattern 30 may be used as a mask of the first ion implantation process 50.

The impurity which is injected by the first ion implantation process 50 passes through the upper buffer layer 15 the buffer layer 10, and the lower buffer layer 12 to be injected into the substrate 100.

In the method for fabricating a semiconductor device according to the embodiments of the present inventive concepts, the first ion implantation process 50 may be a halo ion implantation process which injects the impurity into the substrate 100 at a predetermined angle, but is not limited thereto. That is, the first ion implantation process 50 may be an ion implantation process which injects the impurity to be substantially perpendicular to the substrate 100. In FIG. 5, a second impurity region 230 is illustrated as a halo ion region, but is not limited thereto. Therefore, the second impurity region 230 may be configured as a lightly doped impurity extension region.

In the method for fabricating a semiconductor device according to the embodiments of the present inventive concepts, when the first ion implantation process 50 is the halo ion implantation process, the second region II may be a region in which the NMOS is formed so that the second impurity region 230 may be a region including a p-type impurity.

However, when the first ion implantation process 50 is an ion implantation process which forms the lightly doped impurity extension region, the second impurity region 230 may be a region including an n type impurity.

Figure 6:
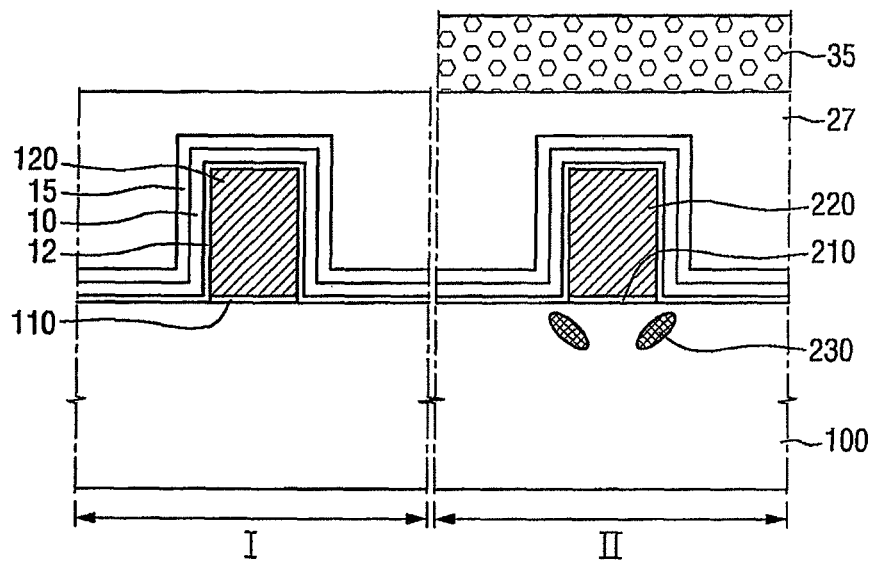

Referring to FIG. 6, in some embodiments, the first mask pattern 20 and the first photosensitive film pattern 30 which are formed in the first region I are removed to expose the upper buffer layer 15.

For example, gas including hydrogen $H_2$ and nitrogen $N_2$ is used to ash and strip the first mask pattern 20 and the first photosensitive film pattern 30.

Next, a second mask film 27 is formed on the buffer layer 10 to cover the first gate electrode 120 and the second gate electrode 220. Specifically, the second mask film 27 which is formed on the buffer layer 10 is formed to be in contact with the upper buffer layer 15.

In some embodiments of the method for fabricating a semiconductor device according to the embodiments of the present inventive concepts, the second mask film 27 may comprise a bottom anti-reflective coating (BARC) film which is the same as the first mask film 22 of FIG. 3.

Next, a second photosensitive film pattern 35 is formed on the second mask film 27. The second photosensitive film pattern 35 exposes the second mask film 27 which is formed on the first gate electrode 120 but covers the second mask film 27 formed on the second gate electrode 220. That is, the second photosensitive film pattern 35 is formed on the second region II to expose the first region I.

Figure 7:
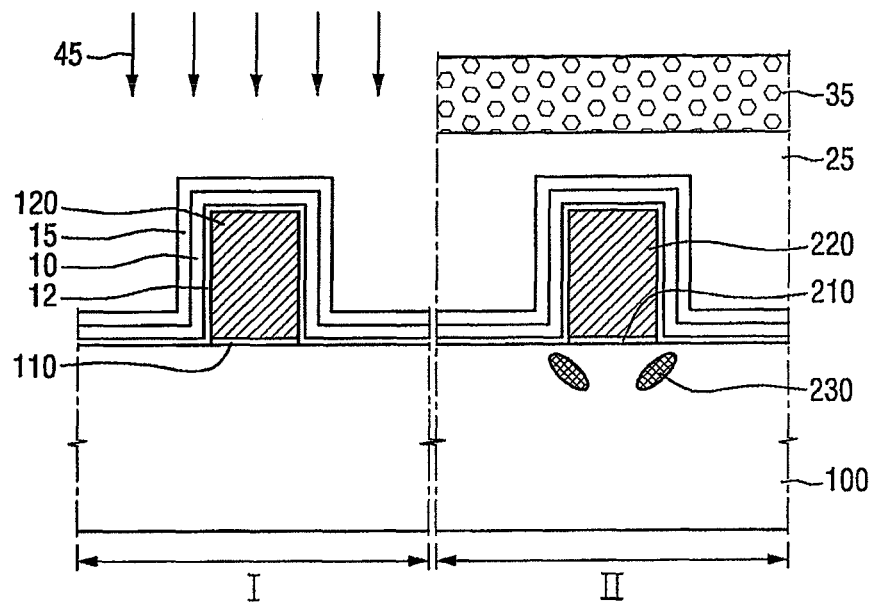

Referring to FIG. 7, the second photosensitive film pattern 35 is used as a mask of a second etching process 45 to remove the second mask film 27 formed in the first region I. That is, through the second etching process 45, the second mask pattern 25 which covers the second region II of the substrate 100 is formed on the buffer layer 10. In some embodiments, the second mask pattern 25 which is formed in the second region II comprises a BARC pattern.

The second mask film 27 which covers the first region I is removed by the second etching process 45 so that the second mask pattern 25 is formed. The upper buffer layer 15 is exposed by the second mask pattern 25. The second mask pattern 25 is formed by the second etching process 45 so that the upper buffer layer 15 may serve as an etch stop layer for the second etching process 45.

In some embodiments, the second mask pattern 25 and the second photosensitive film pattern 35 which are formed in the second region II form a lamination layer to be used as a mask in the second ion implantation process 55 which will be performed later.

In some embodiments, the second etching process 45 which forms the second mask pattern 25 is performed in a condition and a method which are substantially same as the first etching process 40 which has been described with reference to FIG. 4. Accordingly, a repeated description of the second etching process 45 will be omitted.

Figure 8:
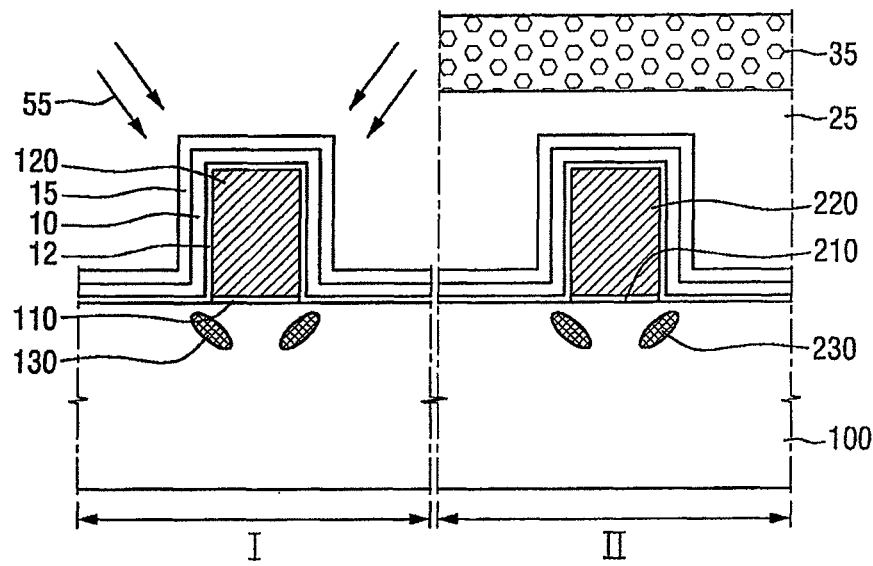

Referring to FIG. 8, the second mask pattern 25 and the second photosensitive film pattern 35 are used as a mask of a second ion implantation process 55 to form the first impurity region 130 at both sides of the first gate electrode 120. The first impurity region 130 is formed in the substrate 100 in the first region I. In some embodiments, the first impurity region 130 may be an impurity region which has a different conductive type from that of the second impurity region 230.

In the method for fabricating a semiconductor device according to the embodiments of the present inventive concepts, the second ion implantation process 55 may be a halo ion implantation process which injects the impurity into the substrate 100 at a predetermined angle, but is not limited thereto. That is, the first impurity region 130 is illustrated as a halo ion region in FIG. 8; however, embodiments are not limited thereto. Therefore, the first impurity region 130 may be a lightly doped impurity extension region, or other type of impurity region.

In the method for fabricating a semiconductor device according to the embodiments of the present inventive concepts, when the second ion implantation process 55 is the halo ion implantation process, the first region I may be a region in which the PMOS is formed so that the first impurity region 130 may be a region including an n-type impurity.

Figure 9:
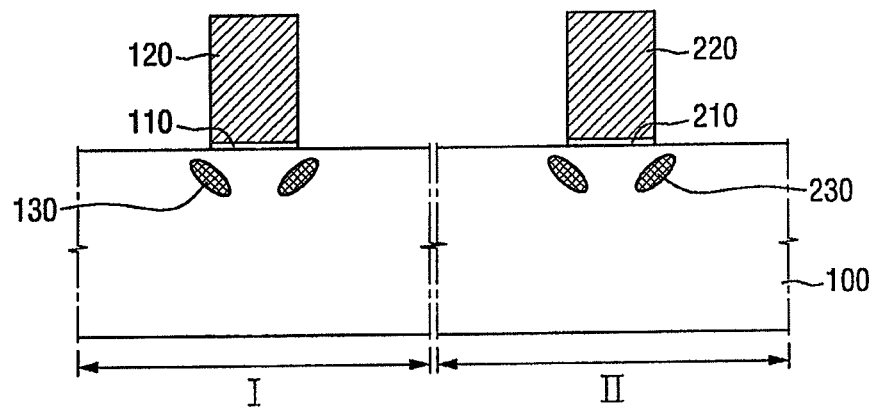

However, when the second ion implantation process 55 is an ion implantation process which forms the lightly doped impurity extension region, the first impurity region 130 may be a region including a p-type impurity Referring to FIG. 9, the second mask pattern 25 and the second photosensitive film pattern 35 which are formed in the second region II are removed to expose the upper buffer layer 15. For example, in some embodiments, a gas including hydrogen ($H_2$) and nitrogen ($N_2$) is used to ash and strip the second mask pattern 25 and the second photosensitive film pattern 35.

Next, the upper buffer layer 15, the buffer layer 10, and the lower buffer layer 12 are sequentially removed to expose the first gate electrode 120, the second gate electrode 220, and the substrate 100.

Specifically, in some embodiments, the upper buffer layer 15 may be removed using a wet etching process. When the upper buffer layer 15 includes a silicon oxide film, the upper buffer layer 15 may be removed using a hydrofluoric acid solution. When the upper buffer layer 15 includes a silicon nitride film, the upper buffer layer 15 may be removed using a phosphoric acid solution.

In some embodiments, the buffer layer 10 may be removed using a wet etching process. When the buffer layer 10 includes a TiN film, the buffer layer 10 may be removed using a hydrogen peroxide solution. When the buffer layer 10 includes an amorphous silicon film, the buffer layer 10 may be removed using an ammonium hydroxide or tetralkyl ammonium hydroxide solution, for example, a tetramethyl ammonium hydroxide (TMAH) solution.

Figure 10:
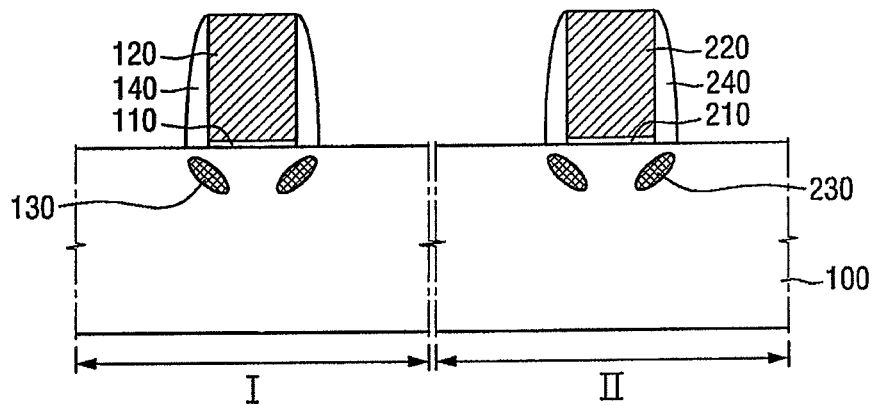

Referring to FIG. 10, a first gate spacer 140 is formed on a side of the first gate electrode 120 and a second gate spacer 240 is formed on a side of the second gate electrode 220.

Specifically, the spacer film is conformally formed on the substrate 100, the first gate electrode 120, and the second gate electrode 220. The spacer film is etched using an anisotropic dry etching process, so that the first gate spacer 140 and the second gate spacer 240 are formed on sides of the first gate electrode 120 and the second gate electrode 220, respectively. The first gate spacer 140 and the second gate spacer 240 may include a silicon nitride film, a silicon oxynitride film, a silicon oxide film, and a combination thereof.

Figure 11:
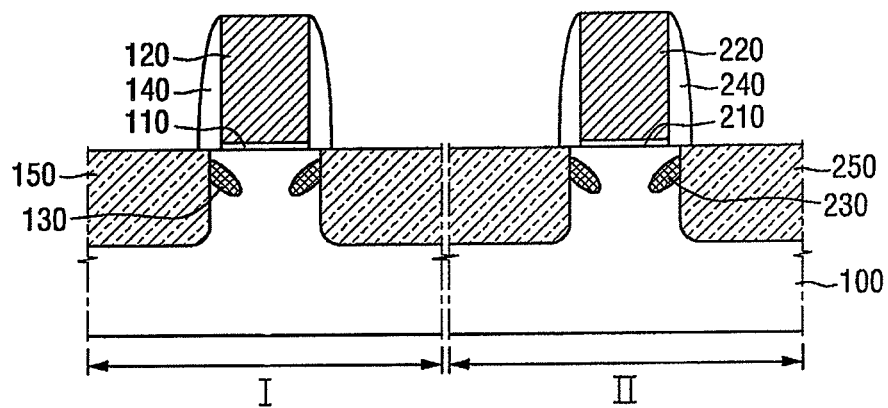

Referring to FIG. 11, a first source/drain 150 is formed at sides of the first gate electrode 120 and a second source/drain 250 is formed at sides of the second gate electrode 220.

In the method for fabricating a semiconductor device according to the embodiments of the present inventive concepts, the PMOS may be formed in the first region I so that the first source/drain 150 may include a compressive stress material having a lattice constant which is larger than that of the substrate 100. For example, when the substrate 100 is a silicon substrate, the compressive stress material may be silicon germanium (SiGe) which has a lattice constant larger than that of silicon. The compressive stress material applies a compressive stress to the first source/drain 150 to improve a mobility of a carrier of a channel region.

In the method for fabricating a semiconductor device according to the embodiments of the present inventive concepts, the NMOS may be formed in the second region II so that the second source/drain 150 may include the same material as the substrate 100 or a tensile stress material. For example, when the substrate 100 is a silicon substrate, the second source/drain 250 may be Si or a material having a lattice constant smaller than that of Si (for example, SiC).

It is described herein that, in the method for fabricating a semiconductor device according to the embodiment of the present inventive concepts, the source/drains 150 and 250 are formed after forming the gate electrodes 120 and 220, but embodiments of the present inventive concepts are not limited thereto. For example, in some embodiments, the source/drain regions can be formed prior to forming the gate electrodes and/or after forming the gate electrodes.

The fabricating method in which a gate electrode is formed after forming the source/drain will be described with reference to FIGS. 12 to 20.

A method for fabricating a semiconductor device according to another embodiment of the present inventive concepts will be described with reference to FIGS. 3 to 8 and 12 to 20.

Figure 12:
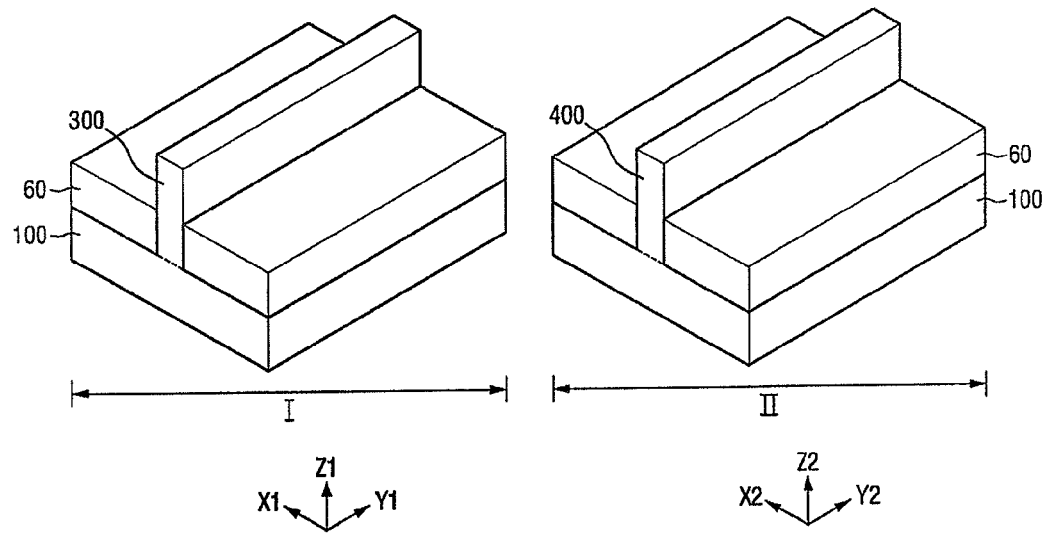
FIGS. 12 to 20 are diagrams illustrating intermediate processes of a method for fabricating a semiconductor device according to another embodiment of the present inventive concepts.
Figure 13:
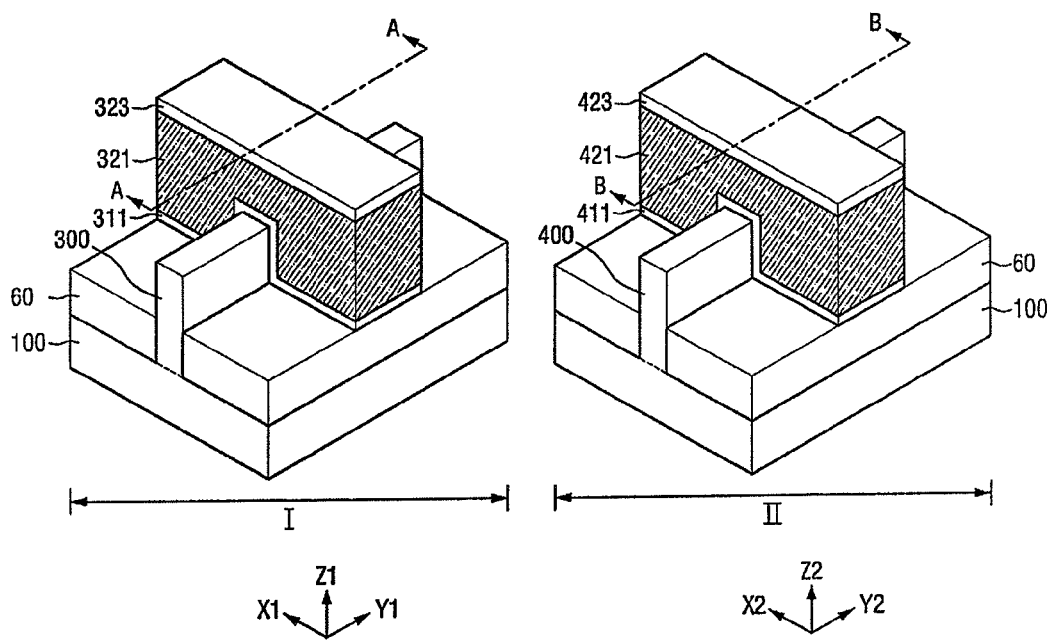
Figure 14:
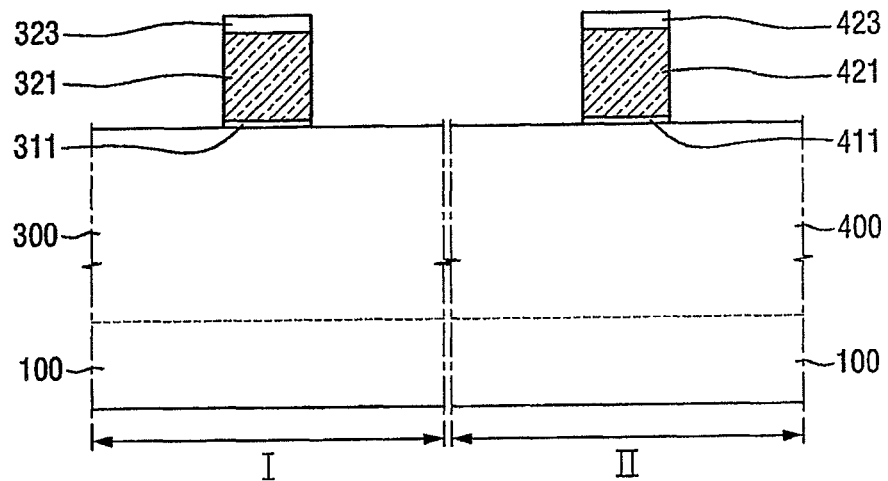

FIGS. 12 to 20 are diagrams illustrating intermediate processes of a method for fabricating a semiconductor device according to another embodiment of the present inventive concepts, in which FIG. 14 is a cross-sectional view taken long lines A-A and B-B of FIG. 13.

Referring to FIG. 12, a first fin type active pattern 300 and a second fin type active pattern 400 are formed on the substrate 100. In some embodiments, the first fin type active pattern 300 is formed in the first region I and the second fin type active pattern 400 is formed in the second region II.

The first fin type active pattern 300 and the second fin type active pattern 400 may extend in an elongated fashion along second directions Y1 and Y2. The first fin type active pattern 300 and the second fin type active pattern 400 may be a part of the substrate 100 and may include an epitaxial layer which is grown from the substrate 100. In some embodiments, the isolation layer 60 may cover side portions of the fin type active pattern 300 and the second fin type active pattern 400.

In some embodiments, the fin type active pattern 300 and the second fin type active pattern 400 may include silicon or germanium which is an elemental semiconductor material. Further, in other embodiments, the first fin type active pattern 300 and the second fin type active pattern 400 may include a compound semiconductor and for example, a IV-IV compound semiconductor or a III-V compound semiconductor. Specifically, as an example of the IV-IV compound semiconductor, the first fin type active pattern 300 and the second fin type active pattern 400 may be a binary compound or ternary compound including at least two of carbon (C), silicon (Si), germanium (Ge), and tin (Sn) or a compound in which a IV element is doped in the above compound. As an example of the III-V compound semiconductor, the first fin type active pattern 300 and the second fin type active pattern 400 may be one of a binary compound, a ternary compound, and a quaternary compound in which at least one of III elements such as aluminum (Al), gallium (Ga), and indium (In) is coupled to one of V elements such as phosphorous (P), arsenic (As), and antimonium (Sb).

Referring to FIGS. 13 and 14, the etching process is performed using a first hard mask pattern 323 and a second hard mask pattern 423 to form a first dummy gate electrode 321 which extends in a first direction X1 so as to intersect the first fin type active pattern 300 and a second dummy gate electrode 421 which extends in a first direction X2 so as to intersect the second fin type active pattern 400.

A first dummy gate dielectric film 311 may be formed between the first fin type active pattern 300 and the first dummy gate electrode 321 and a second dummy gate dielectric film 421 may be formed between the second fin type active pattern 400 and the second dummy gate electrode 421.

The first dummy gate dielectric film 311 and the second dummy gate dielectric film 411 may include one of a silicon oxide film ($SiO_2$), a silicon oxynitride film (SiON), and a combination thereof. The first dummy gate electrode 321 and the second dummy gate electrode 421 may include one of poly silicon (poly Si), amorphous silicon (a-Si), and a combination thereof.

In the method for fabricating a semiconductor device according to another embodiment of the present inventive concepts, even though it is described that the first dummy gate dielectric film 311 and the second dummy gate dielectric film 411 are formed, the inventive concepts are not limited thereto. In other words, the first dummy gate dielectric film 311 and the second dummy gate dielectric film 411 are not re-deposited in a fabricating process which will be described with reference to FIG. 20, but instead a third gate dielectric film 310 and a fourth gate dielectric film 410 including an interfacial layer and a material having a high dielectric constant may be formed, respectively.

Further, in the method for fabricating a semiconductor device according to another embodiment of the present inventive concepts, even though it is described that the first dummy gate electrode 321 and the second dummy gate electrode 421 are formed on the fin type active patterns 300 and 400, the inventive concepts are not limited thereto. In other words, the first dummy gate electrode 321 and the second dummy gate electrode 421 may be formed on a top surface of an active region which is displaced on the same plane as a top surface of the substrate 100 as illustrated in FIG. 1.

Subsequent processes will be described with reference to FIG. 14 which is a cross-sectional view taken along lines A-A and B-B of FIG. 13 and related FIGS. 15-20.

Figure 15:
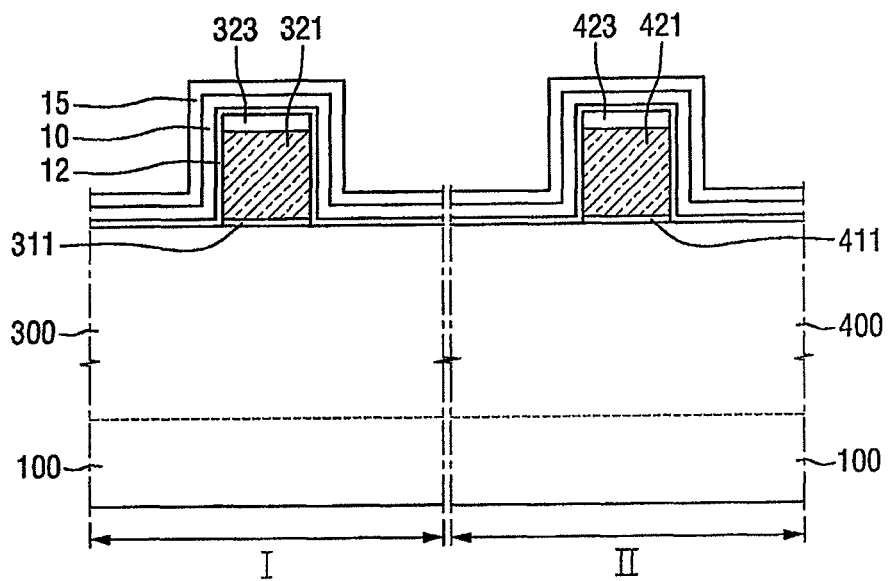

Referring to FIG. 15, the lower buffer layer 12, the buffer layer 10, and the upper buffer layer 15 are sequentially formed on the first fin type active pattern 300 and the second fin type active pattern 400. Specifically, the lower buffer layer 12, the buffer layer 10, and the upper buffer layer 15 are sequentially formed on upper surfaces of the first dummy gate electrode 321 and the second dummy gate electrode 421 and formed along sidewall surfaces of the first dummy gate electrode 321 and the second dummy gate electrode 421. In some embodiments, the lower buffer layer 12, the buffer layer 10, and the upper buffer layer 15 may also be formed on the isolation layer 60 of FIG. 13.

The lower buffer layer 12, the buffer layer 10, and the upper buffer layer 15 may be conformally formed on the first fin type active pattern 300, the second fin type active pattern 400, the first gate electrode 120, and the second gate electrode 220.

The lower buffer layer 12, the buffer layer 10, and the upper buffer layer 15 in the present embodiment, can be the same as that described above in connection with the embodiment of FIG. 2, and thus a repeated description thereof will be omitted.

Figure 16:
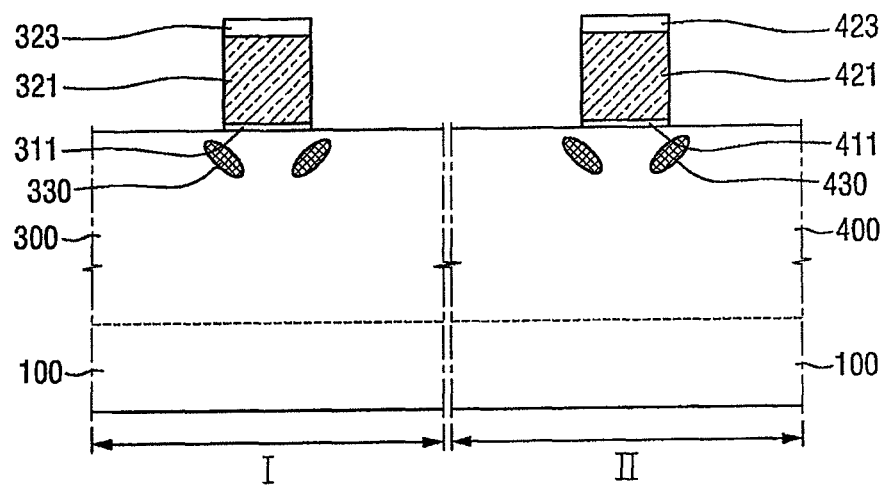

Referring to FIG. 16, by the fabricating process which has been described with reference to FIGS. 3 to 8, a third impurity region 330 is formed at sides of the first dummy gate electrode 321 and a fourth impurity region 430 is formed at sides of the second dummy gate electrode 421. The third impurity region 330 and the fourth impurity region 440 are formed in the first fin type active pattern 300 and the second fin type active pattern 400, respectively.

In some embodiments, the third impurity region 330 and the fourth impurity region 440 may be a halo ion injection region, but are not limited thereto. In some embodiments, the third impurity region 330 may have a different conductive type from that of the fourth impurity region 430.

Referring to FIGS. 8 and 16, the second mask pattern 25 and the second photosensitive film pattern 35 which are formed in the second region II are removed to expose the upper buffer layer 15.

Next, the upper buffer layer 15, the buffer layer 10, and the lower buffer layer 12 are sequentially removed to expose the first dummy gate electrode 321, the second dummy gate electrode 421, the first fin type active pattern 300, and the second fin type active pattern 400.

Figure 17:
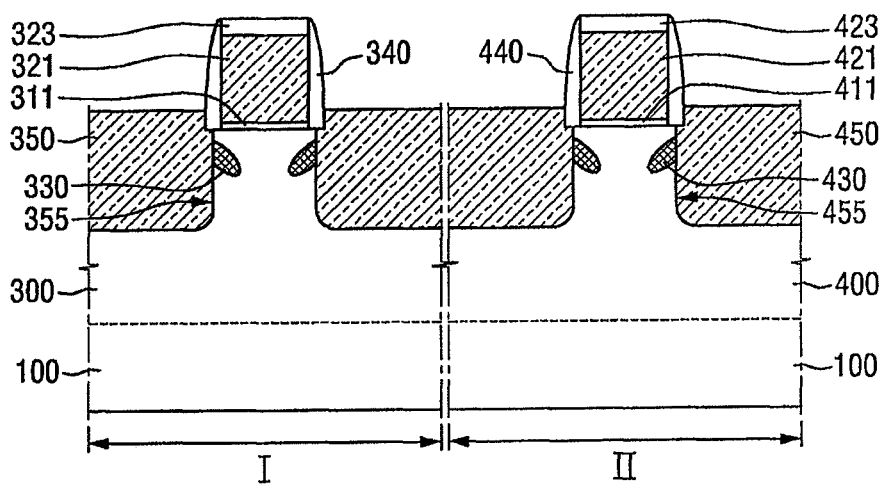

Referring to FIG. 17, a third gate spacer 340 is formed at a side of the first dummy gate electrode 321 and a fourth gate spacer 440 is formed at a side of the second dummy gate electrode 421.

In some embodiments, the third gate spacer 340 and the fourth gate spacer 440 may include a silicon nitride film, a silicon oxynitride film, a silicon oxide film, and a combination thereof, or other suitable materials.

When the third gate spacer 340 and the fourth gate spacer 440 are formed, a first recess 355 and a second recess 455 may be formed in the first fin type active pattern 300 and the second fin type active pattern 400, respectively, but is not limited thereto.

Next, a third source/drain 350 is formed at both sides of the first dummy gate electrode 321 and a fourth source/drain 450 is formed at both sides of the second dummy gate electrode 421. The third source/drain 350 is formed in the first recess 355 and formed on the first fin type active pattern 300. The fourth source/drain 450 is formed in the second recess 455 and formed on the second fin type active pattern 400.

In some embodiments, the first region I may be a region where the PMOS is formed so that the third source/drain 350 may include a compressive stress material having a larger lattice constant than that of the substrate 100 and the second region II may be a region where the NMOS is formed so that the fourth source/drain 450 may include the same material as the substrate 100 or a tensile stress material.

Figure 18:
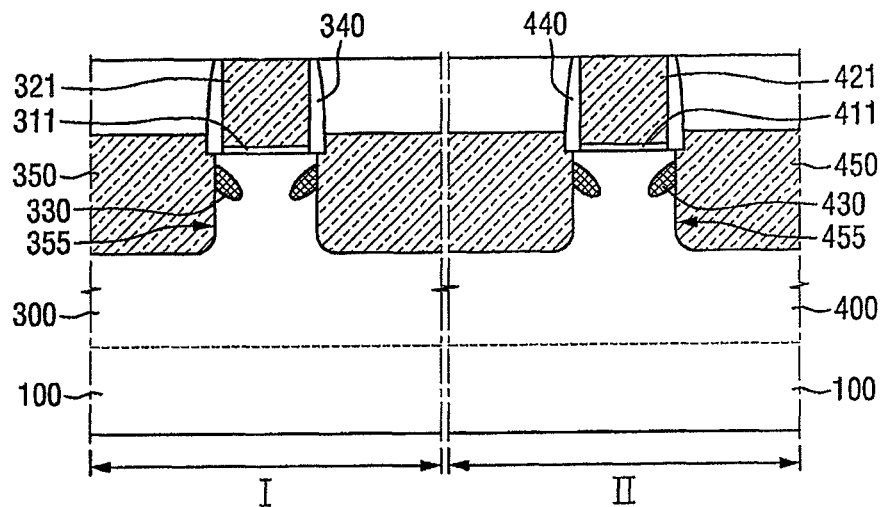

Referring to FIG. 18, an interlayer insulating layer 70 which covers the first dummy gate electrode 321, the second dummy gate electrode 421, the third source/drain 350, and the fourth source/drain 450 is formed on the substrate 100.

The interlayer insulating layer 150 may include at least one of a material having a low dielectric constant, an oxide film, a nitride film, and an oxynitride film. Examples of the material having a low dielectric constant may include flowable oxide (FOX), tonen silazene (TOSZ), undoped silica glass (USG), borosilica glass (BSG), phosphosilaca glass (PSG), borophosphosilica glass (BPSG), plasma enhanced tetra ethyl ortho silicate (PRTEOS), fluoride silicate glass (FSG), high density plasma (HDP), plasma enhanced oxide (PEOX), and flowable CVD (FCVD) and a combination thereof, but are not limited thereto, as other suitable materials may equally apply.

Next, the interlayer insulating layer 70 is planarized until the top surfaces of the first dummy gate electrode 321 and the second dummy gate electrode 421 are exposed. For example, the planarizing process may use a chemical mechanical polishing (CMP) process As a result, the first hard mask pattern 323 and the second hard mask pattern 423 are removed and the top surface of the first dummy gate electrode 321 and the top surface of the second dummy gate electrode 421 are exposed.

Figure 19:
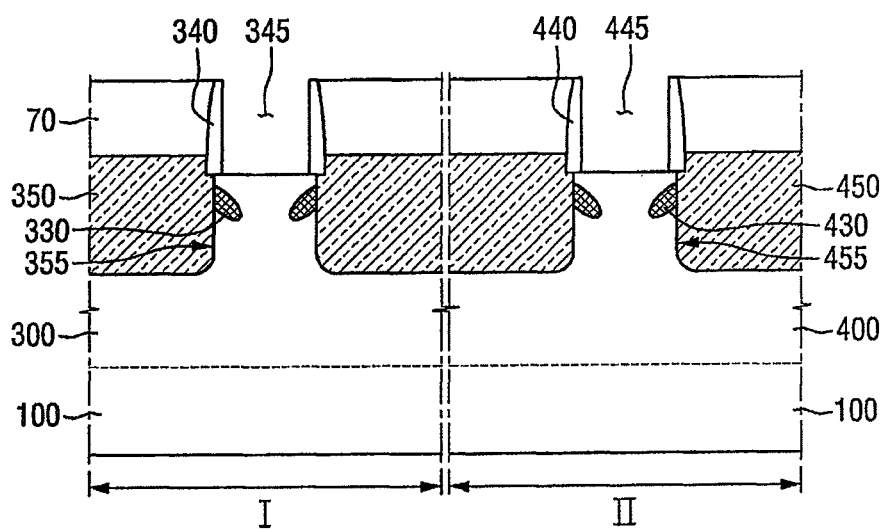

Referring to FIG. 19, the first dummy gate electrode 321 and the second dummy gate electrode 421 are removed. After removing the first dummy gate electrode 321 and the second dummy gate electrode 421, the first dummy gate dielectric film 311 and the second dummy gate dielectric film 411 are removed to form a first trench 345 and a second trench 445. In some embodiments, the top surface of the first fin type active pattern 300 and the top surface of the second fin type active pattern 400 are exposed by the first trench 345 and the second trench 445.

In other words, the interlayer insulating layer 70 which includes the first trench 345 and the second trench 445 is on the substrate 100. The first trench 345 is formed in the first region I and the second trench 445 is formed in the second region II.

In various embodiments, the first dummy gate electrode 321 and the second dummy gate electrode 421 may be removed using a wet process or a dry process. In the wet etching process, in some embodiments, the first dummy gate electrode 321 and the second dummy gate electrode 421 are exposed to an aqueous solution containing a hydroxide source for a sufficient time at a sufficient temperature so that the first dummy gate electrode 321 and the second dummy gate electrode 421 may be substantially removed. In some embodiments, the hydroxide source may include ammonium hydroxide or tetraalkyl ammonium hydroxide, or tetramethyl ammonium hydroxide (TMAH), but is not limited thereto, as other materials are equally applicable.

The first dummy gate dielectric film 311 and the second dummy gate dielectric film 411 may be removed by the wet etching method, the dry etching method, and a combination thereof. The etching solution or the etching gas may vary depending on the material of the first dummy gate dielectric film 311 and the second dummy gate dielectric film 411.

Figure 20:
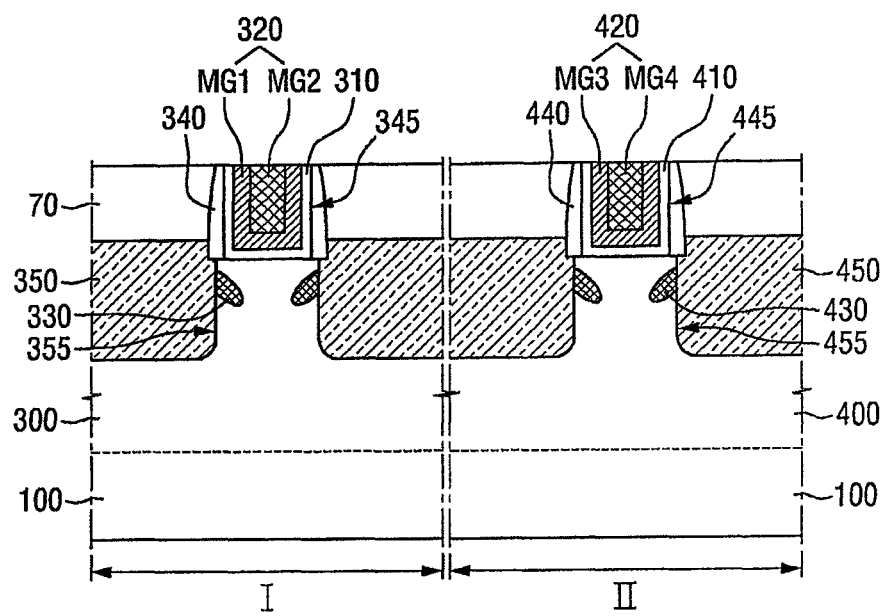

Referring to FIG. 20, a third gate electrode 320 in which the first trench 345 is buried and a fourth gate electrode 420 in which the second trench 445 is buried are formed. Specifically, the third gate dielectric film 310 and the third gate electrode 320 are formed in the first trench 345. The fourth gate dielectric film 410 and the fourth gate dielectric film 410 are formed in the second trench 445.

The third gate dielectric film 310 and the fourth gate dielectric film 410 may include a high dielectric material having a dielectric constant which is higher than that of the silicon oxide film. The third gate dielectric film 310 is conformally formed along the side and the bottom surfaces of the first trench 345 and the fourth gate dielectric film 410 is conformally formed along the side and the bottom surfaces of the second trench 445.

In some embodiments, the third gate electrode 320 may include a first metal layer MG1 and a second metal layer MG2 and the fourth gate electrode 420 may include a third metal layer MG3 and a fourth metal layer MG4. As illustrated in the drawing, the third gate electrode 320 and the fourth gate electrode 420 may be formed by laminating two or more metal layers, respectively. The first metal layer MG1 and the third metal layer MG3 control a work function and the second metal layer MG2 and the fourth metal layer MG4 serve to fill spaces formed by the first metal layer MG1 and the third metal layer MG3. For example, the first metal layer MG1 and the third metal layer MG3 may include, in some embodiments, at least one of TiN, TaN, TiC, TaC, TiAlC, and TiAl. Further, the second metal layer MG2 and the fourth metal layer MG4 may include W or Al. In other embodiments, the third gate electrode 320 and the fourth gate electrode 420 may be formed of Si or SiGe, instead of the metal.

Referring to FIGS. 1 to 21, a method for fabricating a semiconductor device according to another embodiment of the present inventive concepts will be described.

Figure 21:
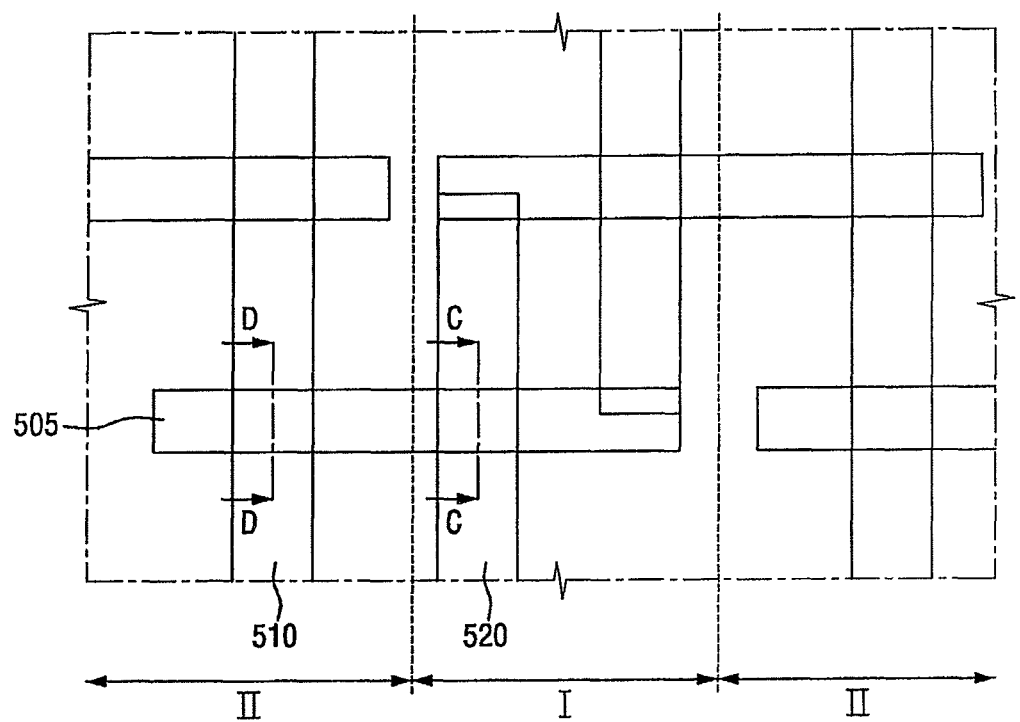
FIG. 21 is a diagram illustrating a layout of intermediate processes of a method for fabricating a semiconductor device according to yet another embodiment of the present inventive concepts.

FIG. 21 is a layout diagram of an intermediate process illustrating a method for fabricating a semiconductor device according to another embodiment of the present inventive concepts.

Referring to FIG. 21, a first active region 520 and a second active region 510 which are adjacent to each other are formed. The first active region 520 is formed in the first region I and the second active region 510 is formed in the second region II. The first active region 520 and the second active region 510 are formed to be elongated in one direction (a vertical direction of FIG. 21).

A gate electrode 505 is formed on the first active region 520 and the second active region 510 to intersect the first active region 520 and the second active region 510. The gate electrode 505 is formed to be elongated in other direction (a horizontal direction of FIG. 21). The gate electrode 505 is formed to extend over the first region I and the second region II.

First, the cross-sectional view taken along lines C-C and D-D of FIG. 21 may correspond to FIG. 1. That is, the first active region 520 and the second active region 510 are active regions which are defined in the substrate 100 so that a top surface of the first active region 520 and a top surface of the second active region 510 may be disposed on the same plane as the top surface of the substrate 10. In this case, in the gate electrode 505 which intersects the first active region 520 and the second active region 510, the gate electrode 505 which is formed in the first region I corresponds to the first gate electrode 120 of FIG. 1 and the gate electrode 505 which is formed in the second region II corresponds to the second gate electrode 120 of FIG. 1.

Alternatively, the cross-sectional view taken along lines C-C and D-D of FIG. 21 may correspond to FIG. 14. That is, the first active region 520 and the second active region 510 may correspond to the first fin type active pattern 300 and the second fin type active pattern 400, respectively. In this case, in the gate electrode 505 which intersects the first active region 520 and the second active region 510, the gate electrode 505 which is formed in the first region I corresponds to the first dummy gate electrode 321 of FIG. 14 and the gate electrode 505 which is formed in the second region II corresponds to the second dummy gate electrode 421 of FIG. 14.

Next, by the fabricating processes of FIGS. 2 to 11 or the fabricating processes of FIGS. 15 to 20, impurity regions may be formed in the first active region 520 and the second active region 510 which are placed at sides of the gate electrode 505.

Figure 22:
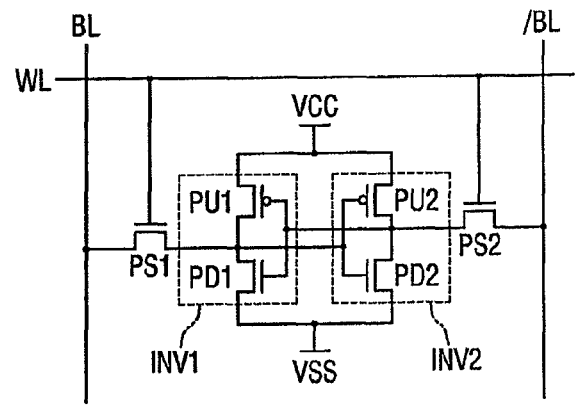
FIGS. 22 and 23 are a circuit diagram and a layout diagram illustrating a semiconductor device which is fabricated using the layout of FIG. 21.
Figure 23:
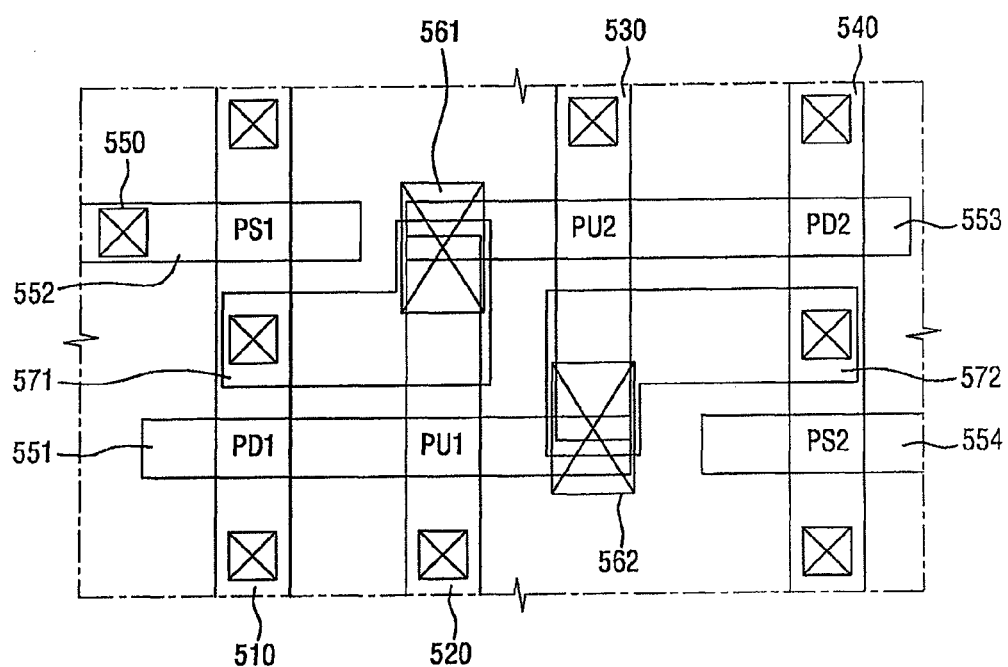

FIGS. 22 and 23 are a circuit diagram and a layout diagram illustrating a semiconductor device which is fabricated using the layout of FIG. 21;

Referring to FIGS. 22 and 23, a semiconductor device fabricated using another embodiment of the present inventive concepts may include a pair of inverters INV1 and INV2 which are connected in parallel between a power node Vcc and a ground node Vss, and a first pass transistor PS1 and a second pass transistor PS2 which are connected to output nodes of the inverters INV1 and INV2, respectively. The first pass transistor PS1 and the second pass transistor PS2 may be connected to a bit line BL and a complementary bit line BL/, respectively. Gates of the first pass transistor PS1 and the second pass transistor PS2 may be connected to a word line WL.

The first inverter INV1 includes a first pull-up transistor PU1 and a first pull-down transistor PD1 which are connected in series and the second inverter INV2 includes a second pull-up transistor PU2 and a second pull-down transistor PD2 which are connected in series. The first pull-up transistor PU1 and the second pull-up transistor PU2 may be PMOS transistors and the first pull-down transistor PD1 and the second pull-down transistor PD2 may be NMOS transistors.

In order to configure one latch circuit, the first inverter INV1 and the second inverter INV2 may be configured such that an input node of the first inverter INV1 is connected to an output node of the second inverter INV2 and an input node of the second inverter INV2 is connected to an output node of the first inverter INV1.

Here, referring to FIGS. 22 and 23, the first active region 520, the second active region 510, the third active region 530, and the fourth active region 540 which are separated from each other are formed to be elongated in one direction (for example, a vertical direction of FIG. 23). Elongated lengths of the first active region 520 and the third active region 530 may be shorter than those of the second active region 510 and the fourth active region 540.

Further, a fifth gate electrode 551, a sixth gate electrode 552, a seventh gate electrode 553, and an eight gate electrode 554 are elongated in other direction (for example, a horizontal direction of FIG. 23) and formed so as to intersect the first active region 520 to fourth active region 540. Specifically, the fifth gate electrode 551 completely intersects the first active region 520 and the second active region 510 and partially overlaps an end of the third active region 530. The seventh gate electrode 553 completely intersects the fourth active region 540 and the third active region 530 and partially overlaps an end of the first active region 520. The sixth gate electrode 552 and the eight gate electrode 554 are formed to intersect the second active region 510 and the fourth active region 540, respectively.

As illustrated in the drawings, the first pull-up transistor PU1 is defined around a region where the fifth gate electrode 551 intersects the first active region 520, the first pull-down transistor PD1 is defined around a region where the fifth gate electrode 551 intersects the second active region 510, and the first pass transistor PS1 is defined around a region where the sixth gate electrode 552 and the second active region 510 intersect each other. The second pull-up transistor PU2 is defined around a region where the seventh gate electrode 553 intersects the third active region 530, the second pull-down transistor PD2 is defined around a region where the seventh gate electrode 553 intersects the fourth active region 540, and the second pass transistor PS2 is defined around a region where the eighth gate electrode 554 and the fourth active region 540 intersect each other.

Even though not clearly illustrated, a source/drain may be formed at both sides of a region where the fifth to eighth gate electrodes 351 to 354 intersect the first to fourth active regions 520, 510, 530, and 540.

Further, a plurality of contacts 550 may be formed.

A shared contact 561 simultaneously connects the first active region 520, the seventh gate line 553 with a wiring line 571. A shared contact 562 simultaneously connects the third active region 530, the fifth gate line 551 with a wiring line 572.

For example, the first pull-up transistor PU1 and the second pull-up transistor PU2 may have a configuration of a transistor described in the first region I of FIGS. 11 and 20, and the first pull-down transistor PD1, the first pass transistor PS1, the second pull-down transistor PD2, and the second pass transistor PS2 may have a configuration of a transistor formed in the second region II of FIGS. 11 and 20.

Figure 24:
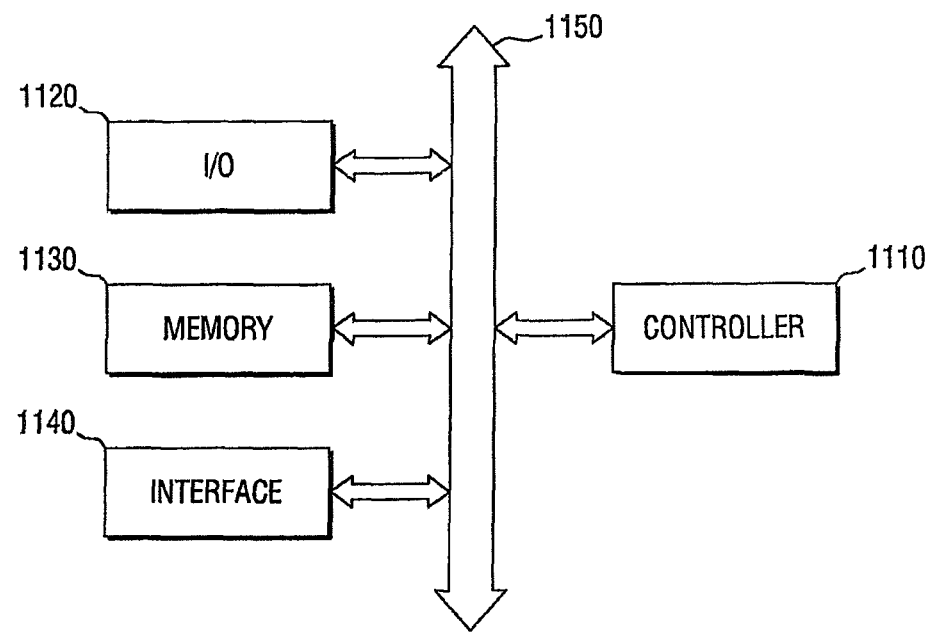
FIG. 24 is a block diagram illustrating an electronic system including a semiconductor device fabricated by the method for fabricating a semiconductor device according to some embodiments of the present inventive concepts.

FIG. 24 is a block diagram illustrating an electronic system including a semiconductor device fabricated by the method for fabricating a semiconductor device according to some embodiments of the present inventive concepts.

Referring to FIG. 24, an electronic system 1100 according to embodiments of the present inventive concepts may include a controller 1110, an input/output device (I/O) 1120, a memory device 1130, an interface 1140, and a bus 1150. The controller 1110, the input/output device 1120, the memory device 1130, and/or the interface 1140 may be connected to each other through the bus 1150. The bus 1150 corresponds to a path through which data moves.

The controller 1110 may include at least one of a microprocessor, a digital signal processor, a micro controller, and logical elements which perform a similar function to the above-mentioned devices. The input/output device 1120 may include a keypad, a keyboard, and a display device. The memory device 1130 may store data and/or a command language. The interface 1140 may perform a function which transmits data to a communication network or receives data from the communication network. The interface 1140 may be a wired or wireless type. For example, the interface 1140 may include an antenna or a wired or wireless transceiver. Even though not illustrated in the drawing, the electronic system 1100 may further include a high speed DRAM and/or SRAM as an operation memory for improving an operation of the controller 1110. The semiconductor device according to the embodiments of the present inventive concepts may be provided in the memory device 1130 or provided as a part of the controller 1110 or the input/output device (I/O) 1120.

The electronic system 1100 may be applied to a personal digital assistant (PDA), a portable computer, a web tablet, a wireless phone, a mobile phone, a digital music player, a memory card or other types of electronic products which may transmit and/or receive information in a wireless communication environment.

Figure 25:
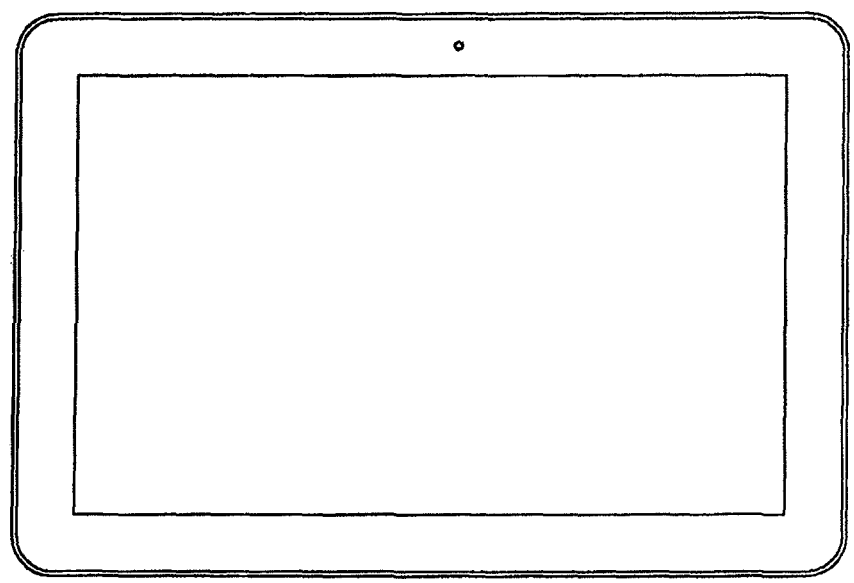
FIGS. 25 and 26 illustrate exemplary semiconductor systems to which a semiconductor device fabricated by the method for fabricating a semiconductor device according to some embodiments of the present inventive concepts may be applied.
Figure 26:
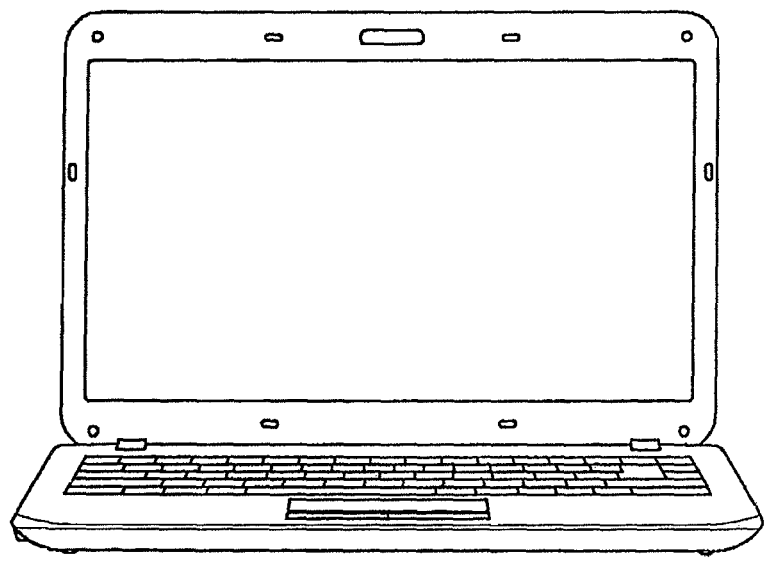

FIGS. 25 and 26 illustrate exemplary semiconductor system to which a semiconductor device fabricated by the method for fabricating a semiconductor device according to some embodiments of the present inventive concepts may be applied.

FIG. 25 illustrates a tablet PC and FIG. 26 illustrates a notebook computer. At least one of semiconductor devices which are fabricated according to the embodiments of the present inventive concepts may be used in the tablet PC or the notebook computer. It is apparent to those skilled in the art that the semiconductor devices according to the embodiments of the present inventive concepts may be applied to other integrated circuit devices which are not illustrated.

The foregoing is illustrative of the present inventive concepts and is not to be construed as limiting thereof. Although a few embodiments of the present inventive concepts have been described, those skilled in the art will readily appreciate that many modifications are possible in the embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of the present inventive concepts and is not to be construed as limited to the specific embodiments disclosed, and that modifications to the disclosed embodiments, as well as other embodiments, are intended to be included within the scope of the appended claims. The present inventive concepts is defined by the following claims, with equivalents of the claims to be included therein.

What is claimed is:

1. A method for fabricating a semiconductor device, comprising:
   providing a first gate electrode and a second gate electrode on a substrate, the first gate electrode and the second gate electrode being formed in a first region and a second region of the substrate, respectively;
   forming a conductive buffer layer along sidewalls of the first gate electrode and the second gate electrode and on upper surfaces of the first gate electrode and second gate electrode;
   forming an upper buffer layer along the conductive buffer layer;
   forming a first mask pattern covering the first region of the substrate on the conductive buffer layer; and
   forming a first impurity region in the substrate at sides of the second gate electrode using the first mask pattern as a mask of an ion implantation process.

2. The method of claim 1, wherein the first mask pattern comprises a bottom anti-reflective coating (BARC).

3. The method of claim 1, wherein the forming of a first mask pattern includes:
   forming a mask film which covers the first gate electrode and the second gate electrode on the conductive buffer layer; and
   removing the mask film which covers the second region using a mixture gas including oxygen.

4. The method of claim 3, wherein the mixture gas further includes chlorine.

5. The method of claim 4, wherein a fraction of oxygen in the mixture gas is a first fraction and a fraction of chlorine in the mixture gas is a second fraction, and
   the second fraction is larger than the first fraction.

6. The method of claim 1, wherein the forming of a first mask pattern includes:
   forming a mask film which covers the first gate electrode and the second gate electrode on the conductive buffer layer; and
   removing the mask film which covers the second region using mixture gas including nitrogen and hydrogen.

7. The method of claim 1, wherein the conductive buffer layer includes a TiN film or an amorphous silicon film.

8. The method of claim 1,
   wherein the upper buffer layer includes at least one of a silicon nitride film and a silicon oxide film.

9. The method of claim 1, further comprising:
   before forming the conductive buffer layer, forming a lower buffer layer along the first gate electrode and the second gate electrode.

10. The method of claim 1, wherein the forming of the conductive buffer layer includes conformally forming the conductive buffer layer on the substrate, the first gate electrode, and the second gate electrode.

11. The method of claim 1, further comprising:
    after removing the first mask pattern, forming a second mask pattern which covers the second region on the conductive buffer layer; and forming a second impurity region having a different conductive type from that of the first impurity region, in the substrate at sides of the first gate electrode using the second mask pattern as a mask of an ion implantation process.

12. The method of claim 11, wherein the second mask pattern comprises a BARC.

13. The method of claim 11, further comprising:
sequentially removing the second mask pattern and the conductive buffer layer to expose the substrate, the first gate electrode, and the second gate electrode.

14. The method of claim 13, further comprising:
forming a first source/drain at sides of the first gate electrode; and
forming a second source/drain at sides of the second gate electrode.

15. The method of claim 1, wherein the ion implantation process comprises a halo ion implantation process.

16. A method for fabricating a semiconductor device, comprising:
providing a first gate structure and a second gate structure on a substrate, at a first region and a second region of the substrate, respectively;
forming a conductive buffer layer along sidewalls of the first gate structure and the second gate structure and on upper surfaces of the first gate structure and second gate structure;
forming an upper buffer layer along the buffer layer;
forming a first mask pattern covering the first region of the substrate on the conductive buffer layer; and
forming a first impurity region in the substrate at sides of the second gate structure using the first mask pattern as a mask of an ion implantation process.

17. The method of claim 16 wherein the first gate structure comprises a first gate electrode and wherein the second gate structure comprises a second gate electrode.

18. The method of claim 17 wherein the first impurity region is formed following providing the first gate electrode and the second gate electrode.

19. The method of claim 17 wherein the conductive buffer layer is present on the sidewalls and upper surfaces of the second gate structure during forming of the first impurity region.

20. The method of claim 16 wherein the first gate structure comprises a first dummy gate electrode and wherein the second gate structure comprises a second dummy gate electrode.

21. The method of claim 20 further comprising, following forming the first impurity region, replacing the first dummy gate electrode and the second dummy gate electrode with first and second gate electrodes respectively.

22. The method of claim 20 wherein the conductive buffer layer is present on the sidewalls and upper surfaces of the second gate structure during forming of the first impurity region.

\* \* \* \* \*